(12) United States Patent
Nasser et al.

(10) Patent No.: US 11,684,537 B2
(45) Date of Patent: Jun. 27, 2023

(54) HUMAN-INTERFACE DEVICE AND A GUIDING APPARATUS FOR A VISUALLY IMPAIRED USER INCLUDING SUCH HUMAN-INTERFACE DEVICE

(71) Applicant: City University of Hong Kong, Kowloon (HK)

(72) Inventors: Arshad Nasser, Kowloon (HK); Kening Zhu, Kowloon (HK)

(73) Assignee: City University of Hong Kong, Kowloon (HK)

( * ) Notice: Subject to any disclaimer, the term of this patent is extended or adjusted under 35 U.S.C. 154(b) by 91 days.

(21) Appl. No.: 17/367,868

(22) Filed: Jul. 6, 2021

(65) Prior Publication Data

US 2022/0233391 A1  Jul. 28, 2022

Related U.S. Application Data

(60) Provisional application No. 63/141,000, filed on Jan. 25, 2021.

(51) Int. Cl.
*A61H 3/06* (2006.01)
*G06F 3/01* (2006.01)

(52) U.S. Cl.
CPC ............ *A61H 3/061* (2013.01); *G06F 3/016* (2013.01); *A61H 2003/063* (2013.01); *A61H 2201/0285* (2013.01)

(58) Field of Classification Search
CPC combination set(s) only.
See application file for complete search history.

(56) References Cited

U.S. PATENT DOCUMENTS

| | | | |
|---|---|---|---|
| 6,774,795 B2 | 8/2004 | Eshelman et al. | |
| 7,267,281 B2 | 9/2007 | Hopkins | |
| 8,922,759 B2 | 12/2014 | Gassert et al. | |
| 9,789,024 B2 | 10/2017 | Alexander | |
| 2010/0122807 A1* | 5/2010 | Harttig | F25B 21/04 165/185 |
| 2015/0154886 A1* | 6/2015 | Aldossary | G09B 21/004 434/114 |

FOREIGN PATENT DOCUMENTS

| | | |
|---|---|---|
| JP | 2016105770 | 11/2017 |
| KR | 102025832 | 9/2019 |

OTHER PUBLICATIONS

M Bouzit, A Chaibi, KJ De Laurentis, and C Mavroidis. 2004. Tactile feedback navigation handle for the visually impaired. In ASME 2004 International Me-chanical Engineering Congress and Exposition. American Society of Mechanical Engineers Digital Collection, 1171-1177.

(Continued)

*Primary Examiner* — Thomas S McCormack
(74) *Attorney, Agent, or Firm* — Renner Kenner Greive Bobak Taylor & Weber

(57) ABSTRACT

A human-interface device and a guiding apparatus for a visually impaired user including such human-interface device. The human-interface device includes a tactile module arranged to provide a set of haptic signals to a user, wherein the tactile module has a plurality of tactile units each arranged to provide at least a first haptic signal and operable to cooperate with one or more of other tactile units to provide different haptic signals.

24 Claims, 10 Drawing Sheets

(56) References Cited

OTHER PUBLICATIONS

Nada. A., Mashelly, S., Fakhr, M. A., & Seddik, A. F. (Mar. 13, 2015). Effective Fast Response Smart Stick for Blind People. Conference Paper—Apr. 2015. Retrieved Jan. 13, 2022, from https://www.researchgate.net/publication/273452928_Effective_Fast_Response_Smart_Stick_for_Blind_People.
SmartCane (TM) device disclosed at https://assistech.iitd.ac.in/smartcane.php.
WeWalk (TM) cane device disclosed at https://web.archive.org/web/20201129163757/https:/www.openfor.co/wewalk.

* cited by examiner

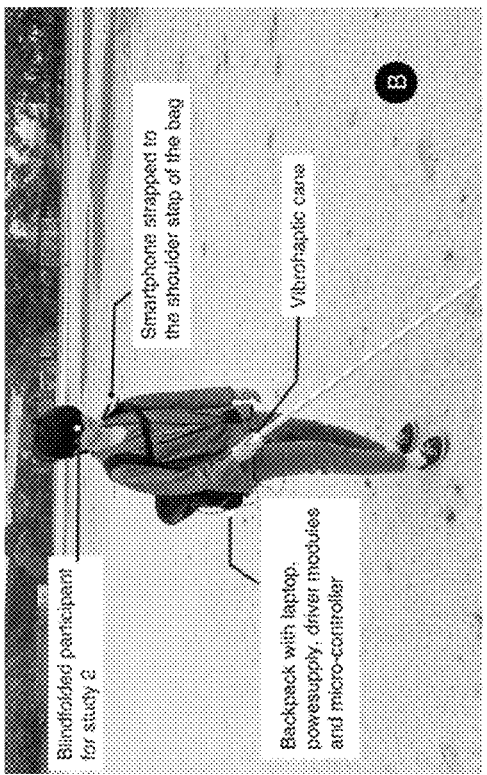
FIG. 11A
FIG. 11B
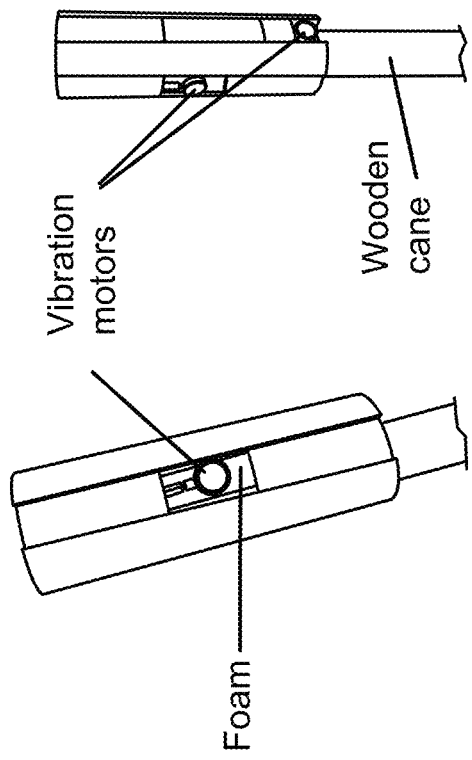
FIG. 12

HUMAN-INTERFACE DEVICE AND A GUIDING APPARATUS FOR A VISUALLY IMPAIRED USER INCLUDING SUCH HUMAN-INTERFACE DEVICE

TECHNICAL FIELD

The invention relates to a human-interface device and a guiding apparatus for a visually impaired user, and particularly, although not exclusively, to an assistive device instrumented with thermal haptic elements.

BACKGROUND

A commonly used tool to present directional or guidance information to users or patrons is to use visual signage or reference points so as to communicate guidance and location information to users. However, for people with visual impairment, visual signage may not be useful or offer any significant assistance and thus there is a need for an alternative form of navigational assistance.

Tactile signage such as tactile tiles paved on floor surfaces may be one possible solution to assist visually impaired persons with navigation. These tactile signs may have a predefined shape and layout which provide a tactile feel to a user when the user steps or touches the tile. Whilst these tactile signs are helpful in providing reference information, they are limited in the assistance rendered to users. Alternatively, other forms of passive guidance may be provided to people with visual impairment via a cane or similar assistive device, such that a user of the cane may avoid obstacles ahead of the user so as to minimize a chance of accident that may occur due to such obstacles.

SUMMARY

In accordance with a first aspect of the present invention, there is provided a human-interface device, comprising a tactile module arranged to provide a set of haptic signals to a user, wherein the tactile module has a plurality of tactile units each arranged to provide at least a first haptic signal and operable to cooperate with one or more of other tactile units to provide different haptic signals.

In an embodiment of the first aspect, the first haptic signal includes a thermal feedback signal.

In an embodiment of the first aspect, the tactile module comprises at least one thermal pad arranged to provide the thermal feedback signal to the user.

In an embodiment of the first aspect, the thermal pad thermal feedback signal includes increasing and/or decreasing a temperature of the thermal pad.

In an embodiment of the first aspect, the thermal pad includes a peltier device.

In an embodiment of the first aspect, the peltier device comprises a Bismuth Telluride dice array.

In an embodiment of the first aspect, the peltier device is flexible.

In an embodiment of the first aspect, each of the plurality of tactile units is further arranged to provide a second haptic signal different from the first haptic signal.

In an embodiment of the first aspect, the first haptic signal includes a hot sensation stimulation and the second haptic signal includes a cold sensation stimulation, or vice versa.

In an embodiment of the first aspect, one or more of the plurality of tactile units are arranged to provide a vibrotactile signal as the first haptic signal or the different haptic signals.

In an embodiment of the first aspect, the set of haptic signals includes a combination of a thermal feedback signal and a vibrotactile signal.

In an embodiment of the first aspect, the human-interface device further comprises a body arranged to be grip by the user, wherein the plurality of tactile units are provided on different positions at least partially surrounding a peripheral portion of the body.

In an embodiment of the first aspect, the plurality of tactile units cooperate to provide the plurality of haptic signals on different positions surrounding the peripheral portion.

In an embodiment of the first aspect, the plurality of haptic signals includes spatially alternating hot and cold sensation stimulations surrounding the peripheral portion.

In an embodiment of the first aspect, the plurality of haptic signals include a hot-only sensation stimulations or a cold-only sensation stimulation provided at only a single predetermined position surrounding the peripheral portion.

In an embodiment of the first aspect, the plurality of tactile units include three to five tactile units provided on the different positions surrounding the peripheral portion of the body and being evenly separated from each other.

In an embodiment of the first aspect, the human-interface device further comprises a wearable body arranged to be worn by the user, wherein the plurality of tactile units are provided on different positions of the wearable body.

In an embodiment of the first aspect, the wearable body include a piece of glove or a pair of gloves.

In accordance with a second aspect of the present invention, there is provided a guiding apparatus for a visually impaired user, comprising a human-interface device in accordance with the first aspect, wherein the body of the human-interface device is attachable at an end of a cane.

In an embodiment of the second aspect, the human-interface device is further arranged to provide navigation information via the set of haptic signals provided by the tactile module.

In an embodiment of the second aspect, the navigation information includes guiding the user to move forward, stop, left turn, right turn and U-turn.

In an embodiment of the second aspect, the guiding apparatus further comprises a navigation module arranged to process position information so as to provide the navigation information to the user.

In an embodiment of the second aspect, the navigation module includes a GPS navigation system.

BRIEF DESCRIPTION OF THE DRAWINGS

Embodiments of the present invention will now be described, by way of example, with reference to the accompanying drawings in which:

FIGS. 7A to 7C are confusion tables for Study 1 with BVI participants.

FIGS. 11A and 11B are images showing a cane grip with vibration modules, and a user setup in Study 2.

FIG. 12 is a confusion table of navigation instructions in Study 2 for BVI participants: row is the stimuli and the column is the participants' responses.

DETAILED DESCRIPTION

Figures 1A, 1B:
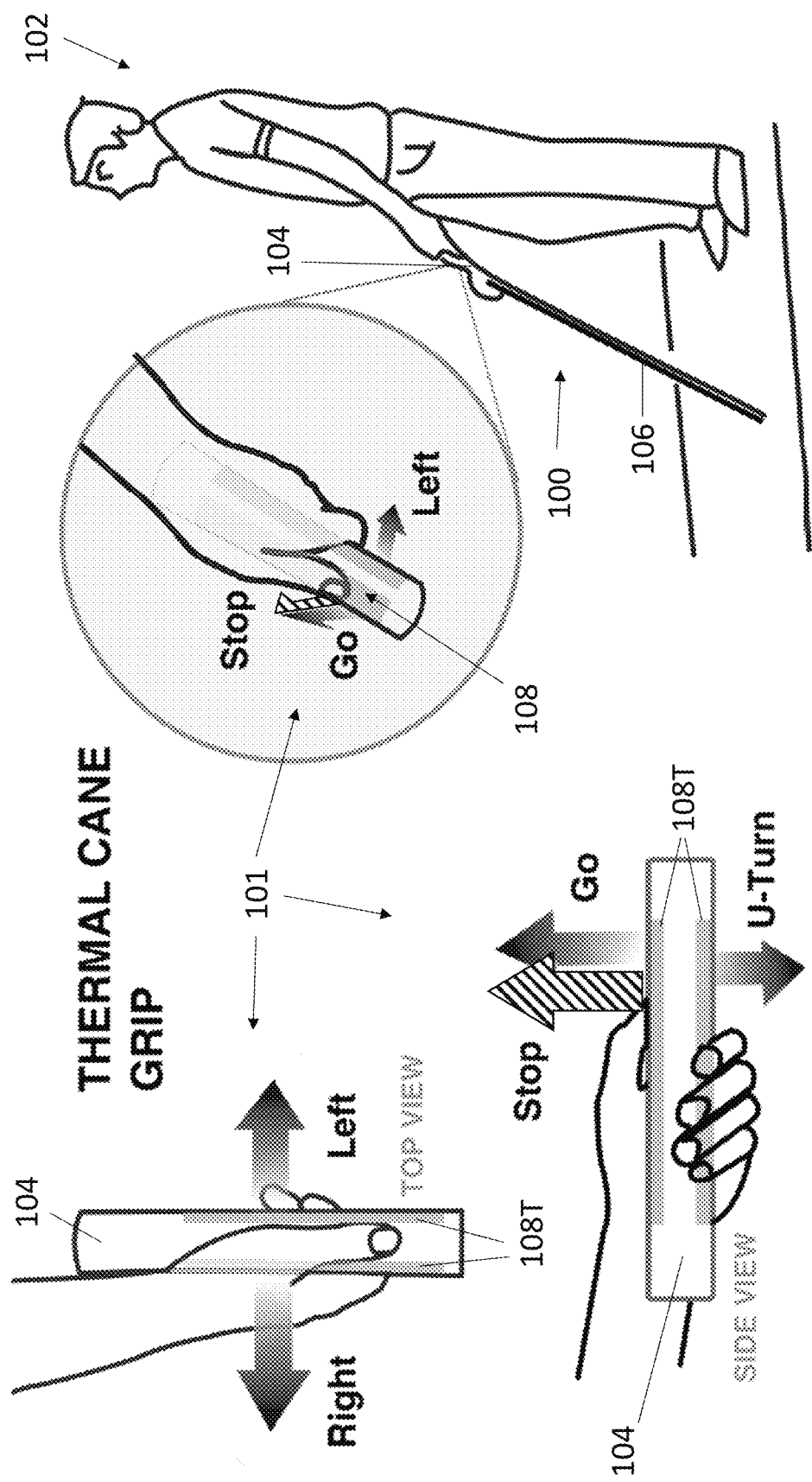
FIGS. 1A and 1B are illustrations showing an embodiment a human-interface device, and a guiding apparatus including the human-interface device, in accordance with embodiments of the present invention.

The inventors, through their own research, trials and experiments, devised that white canes may be used by the blind and visually impaired people for mobility and obstacle detection. For example, electronic canes may address the issues of obstacle detection using the vibrotactile feedback patterns within the cane grip. These electronic canes may detect the nearby objects with the help of ultrasonic sensors and can give a variety of intensities and patterns of vibrational feedbacks to the users holding the cane to help them recognize the obstacles.

According to 2018 data of the World Health Organization, there are around 440 million visually impaired (blind or low-vision) people in the world. It is common for BVI people using white canes while navigating, mostly for recognizing the obstacles. However, white canes may have a limited field of "view" due to their fixed length. In addition, it is challenging for the passive/non-interactive cane itself to notify directional cues for BVI users' navigation.

Besides the white canes, BVI users may also utilize various digital technologies, such as GPS, to support daily space navigation and target searching. GPS devices usually offer the auditory representation of the information and could potentially help the BVI persons for spatial navigation. Non-visual feedback (e.g., auditory and haptic) has been used as directional cues for the blind and visually impaired (BVI) users. However, the auditory information could be interfered in a noisy environment, and it may interrupt users' on-going verbal conversation, music, or radio program.

To improve these devices, haptic feedback, mainly vibrotactile feedback, may be introduced as the navigational cues for sighted and BVI people. The vibrotactile feedback has been applied for different purposes, including navigation and notifications/warnings. Also, the vibrotactile feedback may be used individually as well as in combination with other modalities for notification on the move.

Without wishing to be bound by theory, tactile units may be integrated in different assistive device for BVI users. For example, a wearable glove device with piezo-electric vibrotactile units may be used to represent the stereo-image information for BVI users' real-world environment understanding. Alternatively, a handheld device with a 4×4 array of vibration motors around the handle, may be used to help BVI users to navigate in an unfamiliar space.

Other examples include a vibrotactile vest for BVI users' obstacle avoidance, a 4×4 grid of vibrotactile actuators on the back of a vest to indicate turn information, wrist-worn devices with two haptic actuators that were controlled by a remote observer to help blind users avoid obstacles while walking, a haptic helmet combined with a depth camera to help blind users avoid collisions, a haptic belt with eight motors to provide directional guidance in discrete 45° increments.

Further examples includes a multi-spot vibrotactile directional cues in the form factor of a waist belt, with the directional cues presented on the front side of the waist, and the instructional vibrations (e.g., stop) on the back, a vibrotactile headband for BVI users to augment the users' spatial awareness in everyday life, a set of around-waist vibrotactile icons for guiding the BVI users' navigation, a device with directional vibrotactile feedback around the wrist to support BVI users navigating on the 2D touch screen.

The inventors found that vibrotactile feedback can be applied in the navigation white cane for BVI users. For example, a cane-mounted accessory may be used for obstacle detection and warning, a single vibration motor may be used to notify the obstacle, and validated their design with both blindfolded sighted users and BVI users, alternatively, the distances of the obstacles at different height may be notified through vibration.

In these example embodiments, the vibration intensity of single vibrator or all of the multiple vibrators may be used for representing the distance of the obstacle, while the direction of the obstacle was presented by the on-hand/on-body vibration location. However, the effectiveness of the vibrotactile devices may vary in different form factors, and the vibration feedback could be weakened due to the turbulence generated by the moving process, such as walking and driving.

In addition, sometimes it could be difficult to detect the exact vibration location in the context of multi-point spatial vibrotactile feedback, as the natural turbulence or movements during walking or driving may affect the perception of vibration.

Alternatively or additionally, besides the vibrotactile feedback, the application of thermal feedback for human-computer interaction (HCI) may be employed. Advantageously, thermal feedback may not have these disadvantages of vibration, and the characteristics of single-spot and multi-spots thermal feedback may also be used in mobile devices and smart wearable accessories for general purposes, with a reliable recognition accuracy. In an alternative example, thermal feedback may be integrated on the steering wheel for notifying lane changes and directions in driving simulation.

Compared to the vibrotactile feedback, the inventors devised that thermal feedback could be included in, for example, a hand held device for the pedestrians in which the users may receive a warm stimuli on the device as they moved close to the set destination, a 2D maze game on the touch screen, a steering wheel and compared it with cutaneous push and audio feedback during a simulated driving task. In these examples, the performance increased with the thermal haptic feedback.

Other example adopting thermal feedbacks include a device to indicate the sun direction to BVI users, a handheld haptic device that presented the heat-map navigation information through thermotactile feedback for BVI users, a device incorporating both thermal and vibrotactile feedback to guide participants in a 2D maze a spatial navigation task where users searched for an object on a computer display with a temperature-augmented mouse, thermal devices embedded in the head-mounted display to offer directional cues in VR, the recognition of multi-spot thermal stimuli around the wrist while walking. spatial thermotactile feedback in the form factor of finger ring and direction cues for biking, In one preferred embodiment, flexible peltier-based thermal modules may be attached on the grip of a white cane for obstacle notification for blind people, and the inventors have evaluated the temperature-changing performance of the flexible politer module for blind people from a user's point of view. The inventors have performed in-depth investigation on how BVI users may perceive this type of tactile feedback, especially how to design assistive devices with thermal feedback.

In addition, the invention uses thermal modality to give feedback on the cane grip which can be programmed to be useful for navigation as well as other notifications from a connected smartphone or nearby by surrounding devices.

The invention presented here discusses the design and the of white-cane grip instrumented with thermal haptic elements that offers thermal feedback. Preferably, an electronic grip can be wirelessly connected to an external electronic device such as a smartphone/smartwatch/computer or other handheld devices and can communicate between each other. While in use, the device can output thermal feedback (hot and cold) with distinct intensities and patterns (predetermined by the users) corresponding to the signals received from the connected external devices.

The electronic grip is adapted to output thermal feedback on the cane surface depending on the predefined thermal patterns. The thermal feedback mechanism is based on the Peltier effect. The thermal feedback (hot and/or cold) is achieved with the help of the several "couples" of Bismuth Telluride dices (can be effectively called as a Peltier module) encapsulating the cane surface.

With reference to FIGS. 1A and 1B, there is provided a guiding apparatus 100 for a visually impaired user 102, comprising a human-interface device 101 having a body 104 which is attached at an end of a cane 106. The human-interface device comprises a tactile module 108 arranged to provide a set of haptic signals to the user 102, wherein the tactile module has a plurality of tactile units 108T each arranged to provide at least a first haptic signal and operable to cooperate with one or more of other tactile units to provide different haptic signals.

In this embodiment, the guiding apparatus 100 or assistive device is provided in form of a cane or a post, which may be held by a user 102 as shown in FIG. 1B. At the end where the cane 106 is grasped by the user 102, there is provided a tactile module 108 comprising four tactile units 108T disposed on top, bottom, left and right sides of the grip body 104. By providing different tactile feedback signals to the user, navigation information such as guiding the user to move forward, stop, left turn, right turn and U-turn may be provided to the user 102.

Preferably, the tactile units 108T may be thermal pads arranged to provide the thermal feedback signal to the user 102, and the feedback signal may be provided in the form increasing and/or decreasing a temperature of the thermal pad. For example, the block arrows in FIGS. 1A and 1B represents a cold sensation stimulation and the arrow filled with strips represents a hot sensation stimulation. To guide a user to move forward, turn left, turn right or to make a U-turn may be represented by a cold sensation stimulation provided at the top, left, right or bottom portion of the grip respectively.

In contrast, to guide a user to stop, a hot sensation stimulation may be provided at the top portion of the grip. Advantageously, the hot sensation stimulation is easily distinguished from the cold sensation stimulation therefore it will be very easy for a user to intuitively informed to stop, but not moving in any direction represented by cold sensation stimulations. Alternatively, the representation of different commands or navigation information may assigned based on other user's preferences.

Referring to FIG. 1A, the human-interface device 101 may be provided as a standalone device that may be attached to a cane 106 so as to convert a simple white cane into a smart device. The inventors also referred the human-interface device 101 as a "thermal cane grip". It is also possible that the human-interface device 101 or the thermal cane grip may be integrally formed at the gripping end of a cane 106 as manufactured.

The inventors devised that the palm area is one body part with high thermal sensitivity, and it is commonly used by BVI people in many daily activities of information comprehension. Preferably, the guiding apparatus in accordance with embodiments of the present invention, or the "ThermalCane", integrates the spatial thermal feedback into the white-cane grip to support BVI users' spatial navigation. Advantageously, BVI users can receive the feedback of temperature change on their hands while holding the ThermalCane, and further induce the navigation direction.

The ThermalCane technically combines the thermotactile feedback in HCI and haptic navigation aids for both sighted and BVI users.

The inventors considered a list of design recommendations for the thermal display based on psychological evidence. Thermal feedback in HCI has provided important insights such as: 1) hand is a body part with high thermal sensitivity; 2) the perception of thermal feedback could be strongly affected by clothes and the environment; 3) a set of thermal icons with an overall recognition accuracy of 83% can be designed using the rate and the direction of temperature change.

In addition, thermal feedback could enhance the emotional perception of text-based information and could be used to support on-screen navigation for sighted users, and thermal pattern recognition on the hand and arm with single thermoelectric module integrating with model-based approach may be used for designing thermal icons. Moreover spatial thermal feedback in wearable accessories, such as finger ring, bracelet, earhook, etc. may be included in the ThermalCane embodiments.

Taking BVI users' feedback and preference into account, in the preferred embodiment as shown in FIGS. 1A and 1B, as well as some example embodiments to be described later in this disclosure, ThermalCane with four flexible peltier modules around the grip is provided. The user studies showed that the thermal directional cues could reliably be perceived by BVI users while walking, and it outperformed the vibrotactile feedback in terms of accuracy. Thus, thermal feedback can potentially serve as a new type of navigational aid for BVI users.

Considering the common posture of BVI people grasping their white canes and the hardware configuration of thermal actuators, the ThermalCane which integrates a white-cane grip with multi-spot spatial thermotactile feedback may be provided in accordance with an embodiments of the present invention.

White canes are widely used by BVI people these for obstacle detection in walking. There are mainly two types of white canes: rigid and foldable, either of which contains a grip at one end for firm grasping.

Figure 2C:
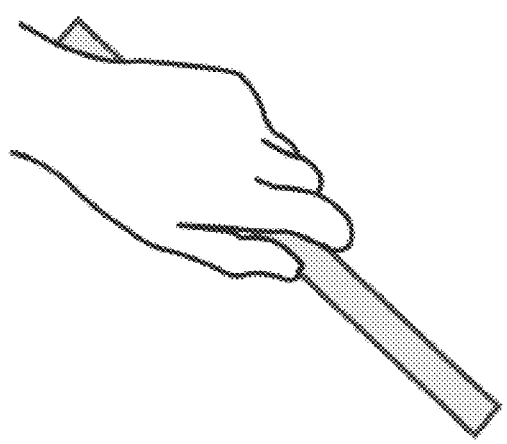
FIGS. 2A to 2C are illustrations showing three different grasping postures of a white cane.
Figure 2B:
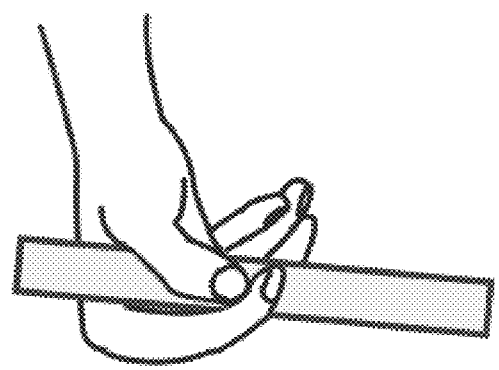
Figure 2A:
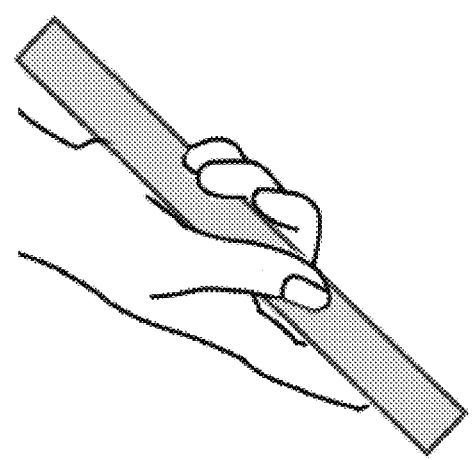

With reference to FIG. 2, there are three common postures for grasping white canes: the index-finger grasp, the pencil grasp, and the handshake grasp, respectively illustrated in FIGS. 2A, 2B and 2C. While it is stated that BVI users may select a participant method of cane grasping depending on the situation, the ThermalCane may be designed according to the hand-shake gripping posture, which may be the most preferred posture by BVIs.

Preferably, the grip may include a body arranged to be grip by the user, and the plurality of tactile units are provided on different positions at least partially surrounding a peripheral portion of the body. More preferably, the plurality of tactile units include three to five tactile units provided on the different positions surrounding the peripheral portion of the body and being evenly separated from each other.

Figure 3:
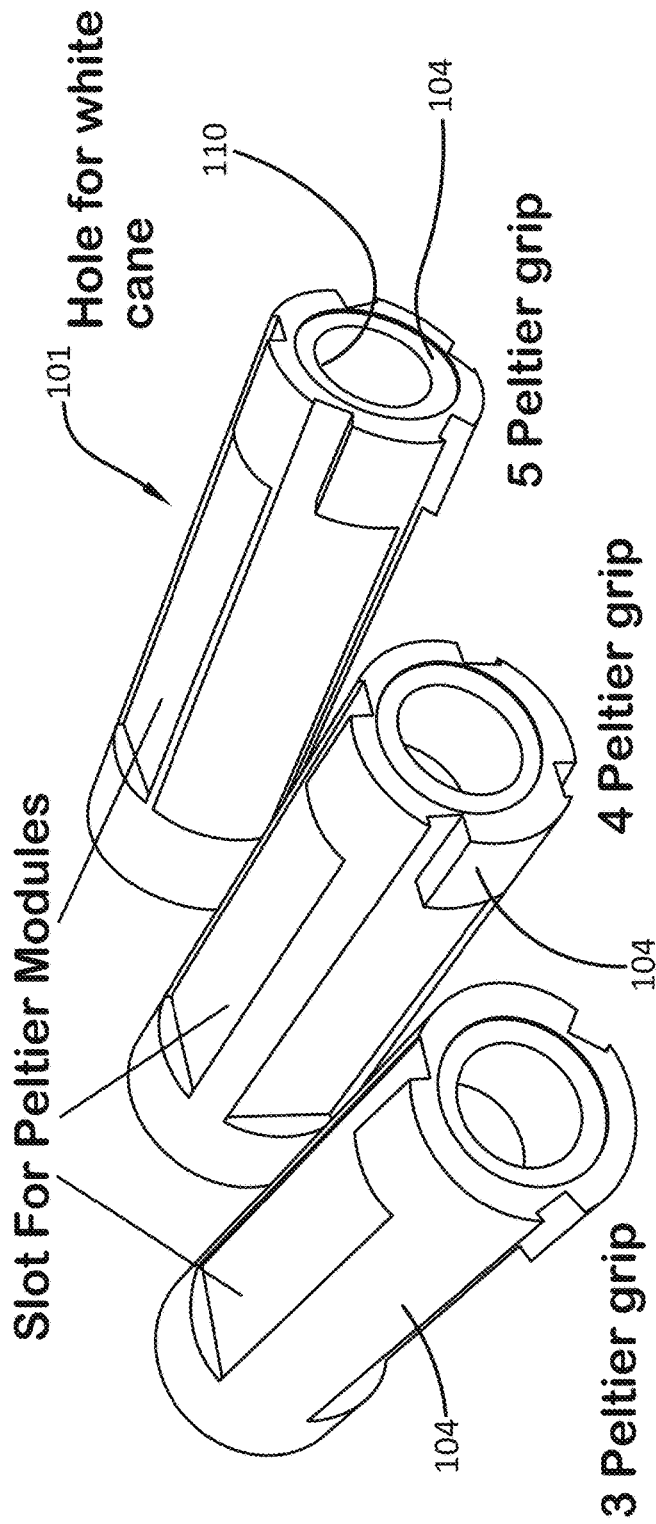
FIG. 3 is an image of three different configurations of thermal cane grips in accordance with embodiments of the present invention, in which the Peltier modules are placed in equal slots around the grip.
Figure 3:
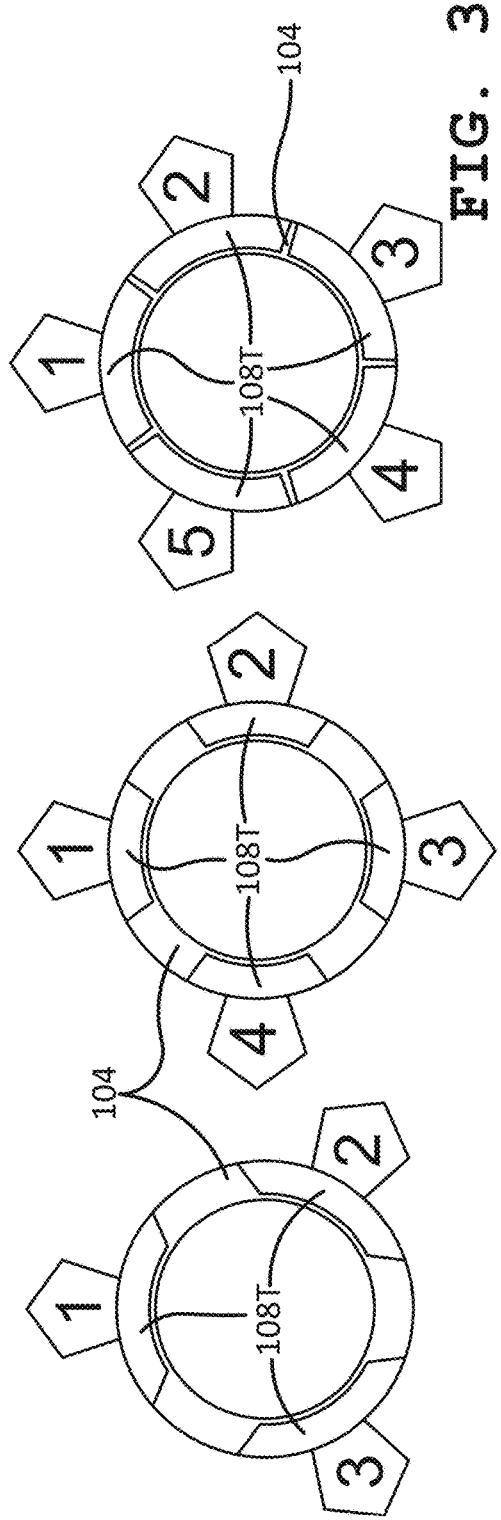

With reference to FIG. 3, the Peltier modules 108T may be arranged around the grip body 104 in the layouts of three, four, and five slots. To ensure the closed contact between the modules 108T and the palm during the handshake grasp, one of the Peltier modules 108T may be placed on the top surface of the grip, and the rest of the modules are placed in equal gaps around the grip.

FIG. 3 depicts 3D-printed models of the thermal cane grips 104 in accordance with embodiments of the present invention. The grips were in the shape of cylinder tube with the inner diameter of 1.5 cm and the outer diameter of 3.6 cm, for the ease of installation on the existing white cane. The grips were 3D printed with PLA (Polylactic Acid), however may also be fabricated using other material and/or manufacturing methods as appreciated by a skilled person in the art.

Considering the dimension of the flexible Peliter module 108T and the average hand size of human, the grips 104 may be flexibly designed and fabricated with three, four, and five slots for the attachment of the flexible Peltier modules, to ensure the modules closely in touch with the whole palm. Once the Peliter modules 108T were attached on the grip, the grip may be further tightened with two rubber bands, ensuring the modules firmly attached. It should be appreciated that other types of fastening means or approached may be adopted to fix the peltier modules to the grip, for example, the peltier modules may be firmly secured to the surface of the grip or in these slots via adhesives.

In addition, each of the 3D printed grips 104 is defined with a concentric hole 110 to accommodate therein an end of a white cane.

Figure 4C:
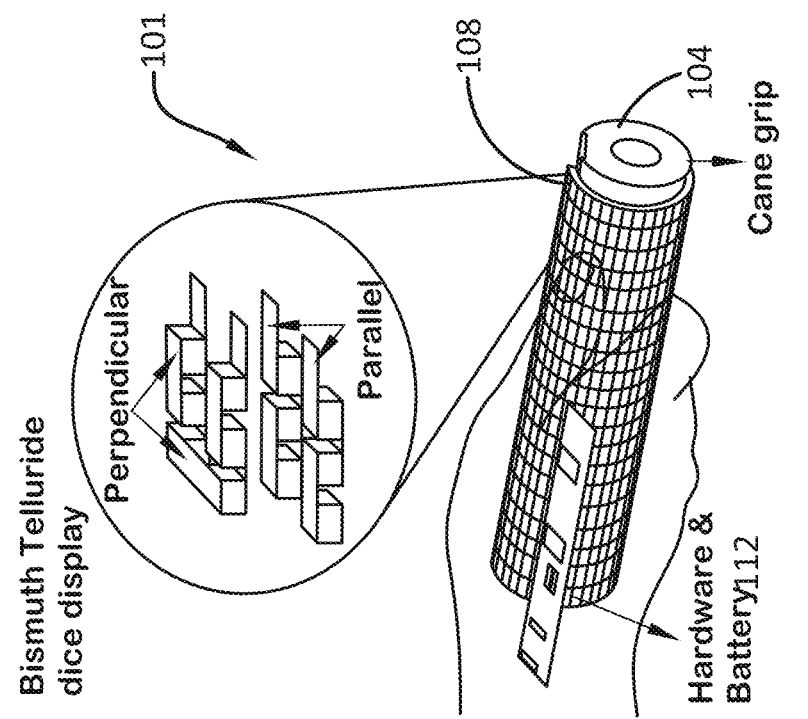
FIG. 4C is an illustration showing the cane grip of FIG. 4B including the internal components of the grip.
Figure 4B:
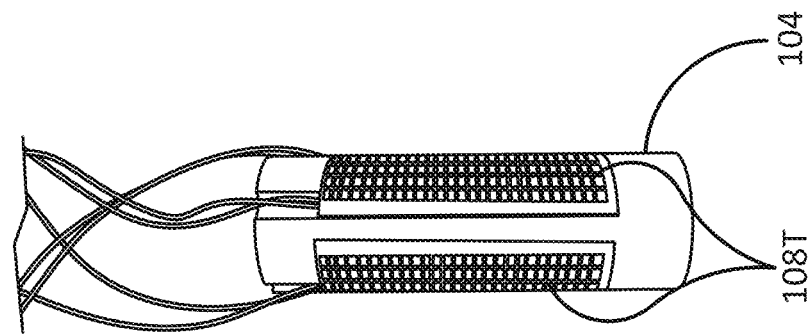
FIGS. 4A and 4B are image showing a flexible Peltier module and the flexible Peltier module being affixed to a four-module grip of FIG. 3.
Figure 4A:
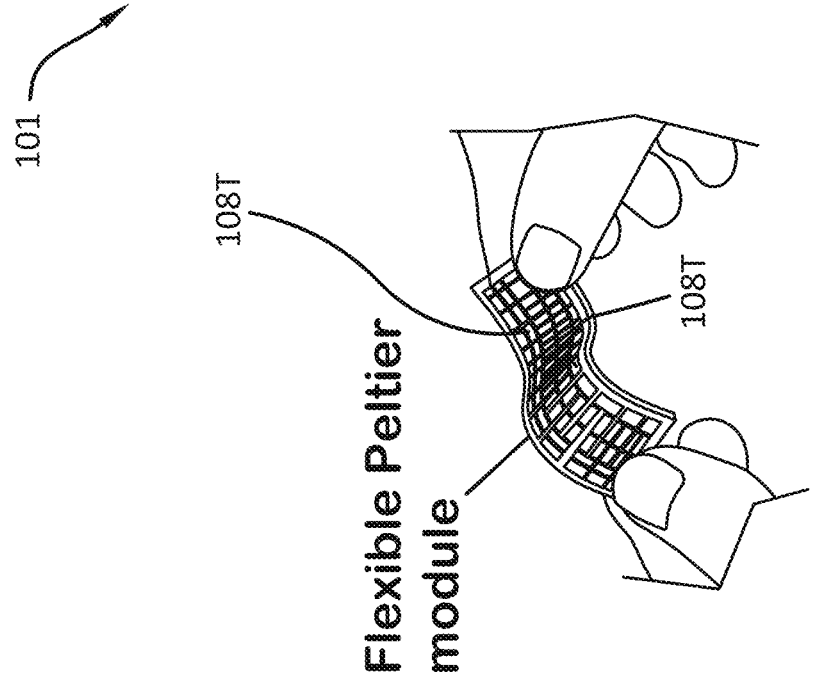

With reference to FIGS. 4A to 4C, flexible peltier devices 108T may be used as thermal pads on the grip to provide the required hot or cold sensation stimulation, or the haptic signals as referred in this disclosure. FIG. 4B shows an example combination of the flexible peltier devices 108T of FIG. 4A on the 3D printed grips 104 in FIG. 3, and FIG. 4C illustrate an example embodiment of the human-interface device 100 including also the controller hardware and battery 112 embedded in the handle grip 104, and that the peltier device 108T comprises a Bismuth Telluride dice array to provide the require thermal tactile signal upon being excited by the controller.

For example, the ThermalCane may be equipped with multiple flexible Peltier modules around the grip. The flexible Peltier module is in the dimension of 23×79×2 mm, and consists of a matrix of micro Peltier elements without the ceramic insulation. These flexible modules are flexible and lightweight, and can fit the surface of the cane grip which is not possible with the solid Peltier modules, and the flexible Peltier module offers higher thermal efficiency, in comparison with the solid counterparts, due to the absence of ceramic insulation and 96 micro Peltier elements in a larger active area of 17×75 mm.

In addition, the Peltier modules may be driven using an H-bridge driver module (Model No.: L298N) and Arduino Uno microcontroller, with an external 9V battery. Each Peltier module draws a maximum of 1 A at 9V during the stimulation. The system may be controlled by the Arduino Uno connected to a laptop through USB, to ensure the fine control of the temperature through Pulse Width Modulation (PWM).

In one example operation, to achieve a temperature-changing rate of $\pm 3°$ C./s, the peltier device may be activated the thermal stimuli for 1.5 s (on for 1.5 s and then switched off), for a comfortable yet perceivable temperature feedback. Alternatively, the stimuli may be provided for 1 second, if a short duration is also appropriate for BVI users. The inventors found that the detection of the stimuli by BVI users may affect their mental load upon receiving the haptic signal or the sensation stimulation.

In one preferable embodiment, the ThermalCane (Grip) has the following key features.

Preferably, the cane grip is can be a circular or an oval shaped tube consisting of various contours which could be made of plastic or metal.

Preferably, the peltier dices are arranged around the cane grip surface in the form of parallel/perpendicular arrays or matrices as shown in the figure with each cell which can be individually controlled and activated to give hot and cold feedbacks individually depending on the input. The cane grip surface can therefore exhibit various thermal patterns on the surface.

Preferably, the dice matrix is covered with a layer/layers of materials that are thermally conductive.

Preferably, there exists a layer between the dice matrix and the grip which can be a perforated/non-perforated thermal conductive material or a heat sink.

Preferably, the cane grip also houses other hardware components such as microcontrollers, drivers, and batteries to drive the Peltier modules. It also consists of a buzzers/speakers, navigation sensors such as GPS modules, accelerometers, gyroscopes, etc and biosensors.

Preferably, the grip also consists of NFC/Bluetooth/Wi-Fi modules for wireless communication with the nearby devices whereas it is not limited to the above mentioned embodiments as it can be modified in various forms.

Preferably, the cane grip can be attached on top of any type of standard white canes available in the market that are used by the visually impaired people.

To optimize and validate the design of ThermalCane, the inventors conducted two user studies. Study 1 was conducted to understand the overall response of the BVI for the thermal haptic feedback, and to obtain the peltier-module configuration that can be reliably perceived by the BVI users. The inventors then investigated the feasibility of using ThermalCane in the outdoor environment by conducting a directional walking experiment with BVI users in Study 2.

In the experimental studies, three embodiments of ThermalCane using flexible Peltier modules, each contains a unique layout of the modules (i.e., 3, 4, and 5 Peltier modules) were tested. In a first experiment, 12 BVI users showed that the users can recognize the spatial thermal stimuli with an average accuracy of 84.7% and an average response time of 2.71 s. The embodiments with three and four Peltier modules were perceived significantly more accurately than the prototype with five modules. Furthermore, the BVI users commented that the cold stimuli was easier and more pleasant to be recognized as a feedback cue when compared to the hot stimuli.

Considering the participants' preference on the four-modules grip configuration for directional notification, the inventors further optimized the ThermalCane, and investigated its effectiveness of offering the directional cues for BVI users. The walking experiments involved 6 BVI users, and showed that the thermal feedback of ThermalCane outperformed the vibrotactile feedback with a significantly higher recognition accuracy. This further showed that the spatial thermal stimuli around the white-cane grip could be an effective directional cues for BVI users' walking activities.

Study 1: On-Palm Thermal Perception of Grip Holding

The inventors conducted Study 1 to understand how BVI users perceive the on-palm multi-spot thermal feedback, as the support of ThermalCane design. The main goal of this study was to understand BVI users' thermal perception of on-palm multi-spot thermal feedback and optimal arrangement of thermal haptic feedback on the palm.

In this Study, twelve visually impaired participants (11 male and 1 female) aging from 25 to 35 years old (Mean=31.5, SD=4.42) were recruited through a local non-profit blind association. 6 out of 12 participants were congenitally blind, and 2 of them suffered form retinal pigmentosa. 10 of them have previous experience with existing vibrotactile white-cane products for notifying obstacles, and the other two participants have experience on vibrotactile feedback of mobile phones. 7 out of 12 the participants were left handed, and they all held the cane grip in their dominant hands. The average palm temperature was 33.2° C. and the average room temperature was 30.3° C.

Figure 5:
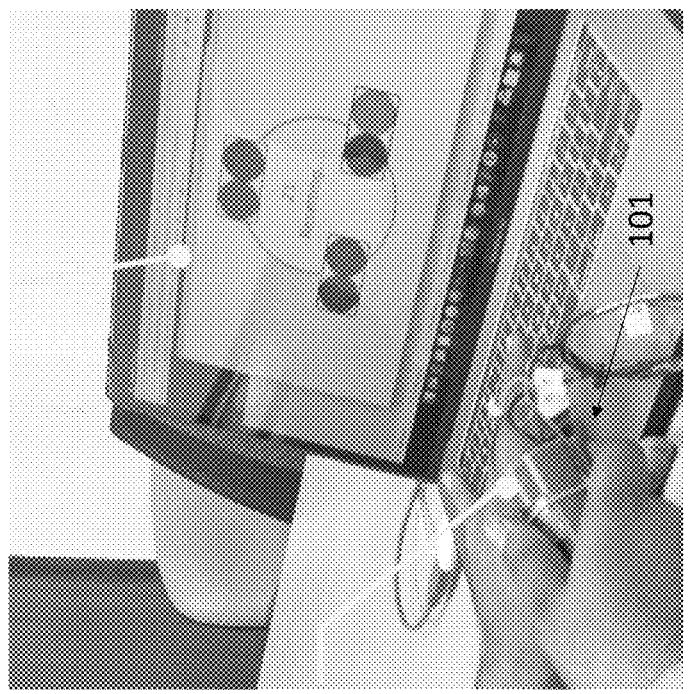
FIG. 5 is an image showing an experiment setup in Study 1.

Three 3D-printed cane grips made accordance with embodiments of the present invention were used in this study. The thermal system on the cane grip was connected to a MacBook Pro laptop through a USB cable. Besides controlling the thermal stimuli and the experiment flow, the laptop also displayed the Processing-based graphical user interface (GUI), as shown in FIG. 5, for registering the participants' responses. ThermalCane as 1.5 seconds, to ensure the detection by BVI users and reduce their mental load.

The inventors designed a within-subject study with the configuration (i.e. the number) of the Peltier modules and the direction of temperature change as the independent variables. The dependent variables included the accuracy, the response time, and the perceived task load of stimuli detection. In each configuration, each of the Peltier modules around the grip was activated using hot (3° C.s) and cold (−3° C.s) stimuli. The order of the three configurations were counter-balanced using Latin Square method for each participant, and the positions and the direction (hot/cold) of the stimuli were randomly presented within each configuration. Each stimulus were repeated twice, which amounted to (3+4+5) positions×2 directions of change×2 repetitions=48 trials for each participant.

The experiment contained one participant and one experimenter, and was divided into three sessions (one for each configuration). Each session consisted of one training block and one testing block. After the initial introduction of the experiment's logistics and filling the pre-questionnaire, the participant was asked to hold the ThermalCane grip on his/her dominant hand in a proper orientation. The thermal stimuli were then activated in a clock-wise order with the top position as the start. Each stimulus lasted for 1.5 s. Meanwhile, the experimenter verbally explained the nature of each stimulation to familiarize the participant with the stimuli. During the explanation, the experimenter numbered the position of the stimulus following the scheme shown in the bottom part of FIG. 3. The participant could choose to repeat the current stimulus for training or move to the next one by verbally reporting to the experimenter.

After training, the participant started the test block, where the stimuli were presented in a randomized order. The selection interface was displayed after each stimulation.

As it may be difficult for the BVI participant to operate the GUI by him/herself, he/she was instructed to rest the other hand on the space bar of the laptop. The participant was also instructed to press the space bar as soon as they felt and confirmed the stimulus. The participant then spoke out the temperature-changing direction (hot or cold) and the numbered position of the stimulus, and the experimenter registered the corresponding stimuli on the selection interface. The timestamp of the participant pressing the space bar was used to calculate the reaction time. There was a 15 s break between two consecutive stimuli. Between two configuration sessions, a temperature-resetting period of 5 minutes were given to the participant. After each the configuration session, the experimenter read out the NASA-TLX questionnaire items to the participants and recorded the responses in a Google form. A short semi-structured interview was conducted in the end of the experiment to collect the participant's subjective comments on his/her experience of the ThermalCane grip. The overall experiment duration per participant was approximately one hour.

Figure 6A:
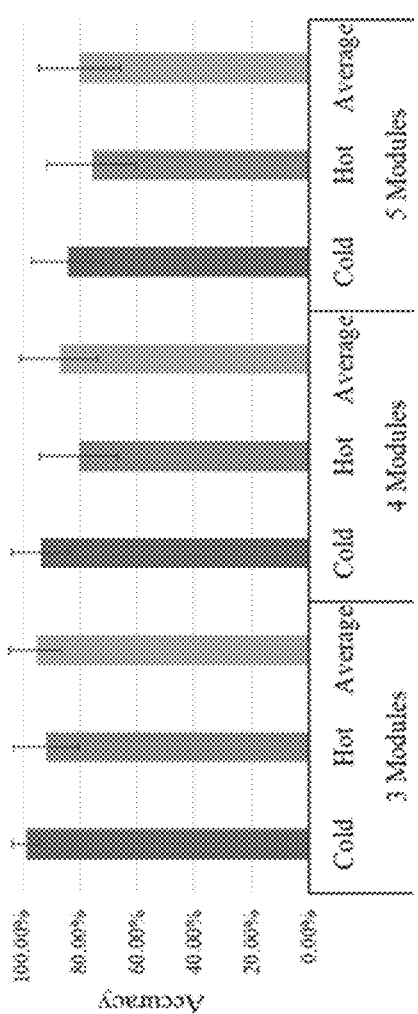
FIG. 6A is a plot showing overall accuracy of stimuli identification in different module configuration in Study 1 with BVI participants.
Figure 6B:
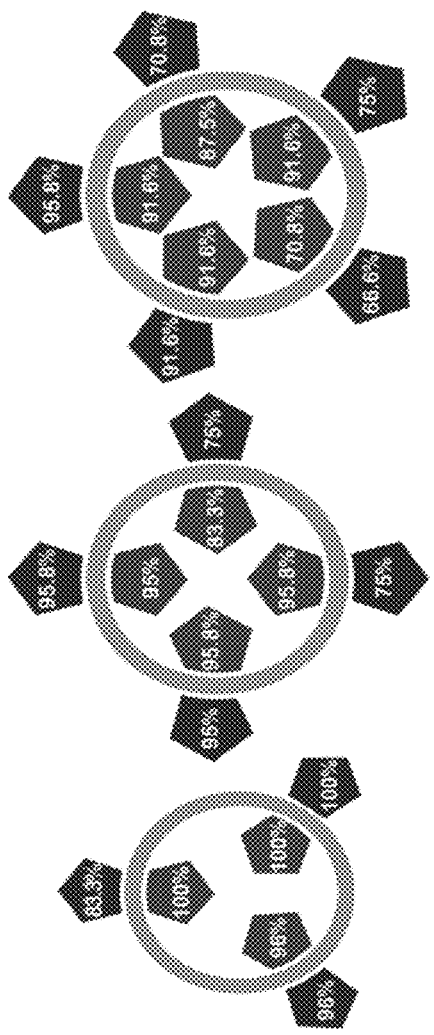
FIG. 6B is an experimental results of the accuracy of individual stimuli identification: a) three-module configuration, b) four-module configuration, c) five-module configuration (outer circle: hot, inner circle: cold).

With reference to FIGS. 6A and 6B, the results revealed the significant effect of the temperature-changing direction ($F(1,11)=18.54$, $p<0.005$, $\eta^2=0.628$). Post-hoc Boferroni test showed that the cold stimuli yielded significantly higher accuracy than the hot ones ($p<0.005$). The Peltier-module configuration also showed a significant effect on the accuracy ($F(2,22)=8.26$, $p<0.005$, $\eta^2=0.429$). The post-hoc Boferroni test revealed that for the cold stimuli, the configuration with five Peltier modules yielded significantly more errors than the three-module configuration ($p<0.005$) and the four-module configuration ($p<0.05$), while there was no significant difference between the accuracy of the three-module configuration and the four-module configuration. For the hot stimuli, the three-module configuration was significantly more accurate than the one with five modules ($p<0.01$), while there was no significant difference between three-module vs four module and four module vs five module.

Figure 8A:
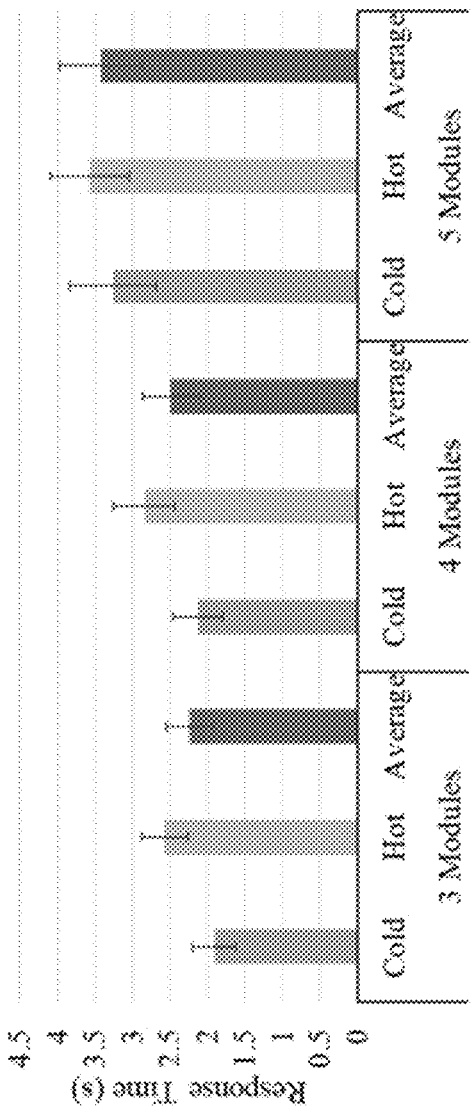
FIGS. 8A and 8B are plots showing, respectively, response Time in Study 1 with BVI participants and NASA-TLX scores for Study 1 with BVI participants.

The response time was defined as the time for a user to respond once the stimulus starts. Similar to the accuracy of recognizing the thermal stimuli, the multi-factorial repeated measures revealed the significant effect of the temperature-changing direction on the participants' response time to the stimuli ($F(1,11)=20.04$, $p<0.005$, $\eta_p^2=0.646$). Post-hoc Boferroni test showed that the hot stimuli yielded significantly longer response time than the cold stimuli did (p<0.005). There was also a significant effect from the type of the thermal-module configuration (F(2,22)=8.73, p<0.05, $\eta^2$=0.442). For both hot and cold stimuli, the five-module configuration resulted in significantly longer response time than the one with three modules (p<0.05) and four modules (p<0.05), while there was no significant difference between the response time to the three-modules and the four-modules configurations. FIG. 8A illustrates the comparison of response time across different temperature-change direction and configurations.

Figure 8B:
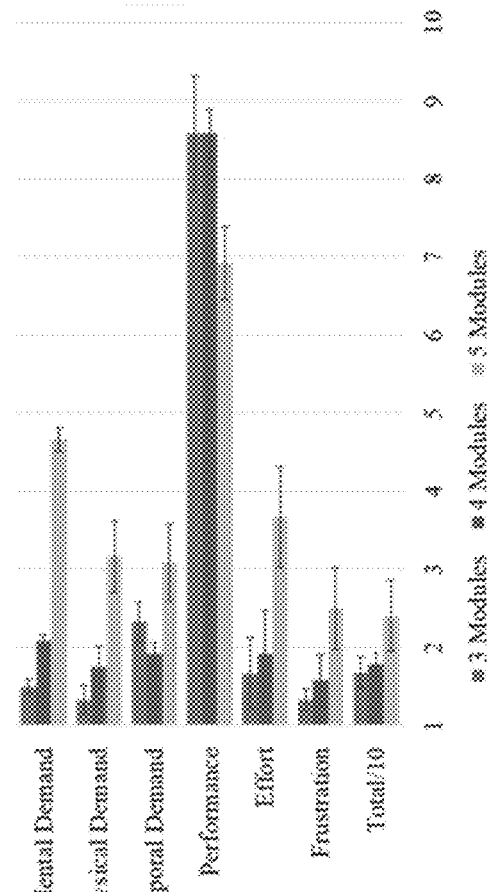

The Friedman tests on the participants' responses on NASA-TLX questionnaire revealed the significant effect of the thermal-module configuration on the participants' ratings on the mental demand ($\chi^2$(2)=18.05, p<0.0005), the physical demand ($\chi^2$(2)=10.06, p<0.005), the effort ($\chi^2$(2)=6.95, p<0.05), and the total score of the NASA-TLX questionnaire ($\chi^2$(2)=10.51, p<0.005. Pairwise Wilcoxon Signed Ranks Test showed that there was no significant difference between the three-modules and the four-modules configurations in all aspect of the NASA-TLX questionnaire. On the other hand, the five-modules configuration was rated significantly higher than the three- and the four-modules configuration in terms of mental demand (5 vs 3: Z=2.85, p<0.005; 5 vs 4: Z=2.95, p<0.005), effort (5 vs 3: Z=2.26, p<0.05; 5 vs 4: Z=2.53, p<0.05), and the total score (5 vs 3: Z=2.75, p<0.005; 5 vs 4: Z=2.36, p<0.05). For the physical demand, the five-modules configuration received significantly higher ratings than the three-modules one (Z=2.67, p<0.05). FIG. 8B depicts the results of the subjective task-load ratings.

Figures 7A, 7B, 7C:
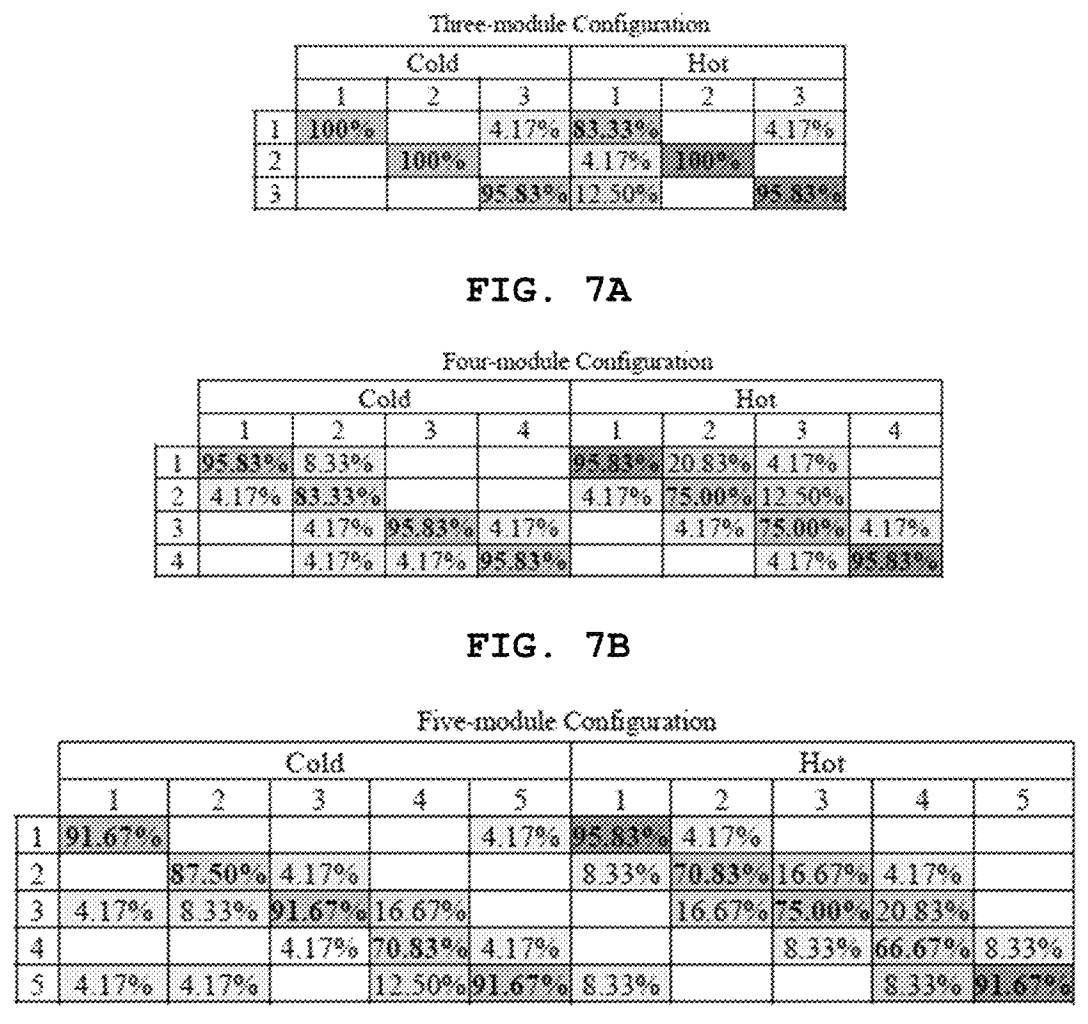

Generally speaking, the participants performed better (i.e. higher accuracy and shorter response time) with the cold stimuli than the hot ones in all the configurations. The confusion matrices in FIG. 7 show that the majority of the errors in the cold stimuli (represented by the percentages in the circle) happened one point away from the correct location. For the hot stimuli (represented by the percentages out of the circle), the errors were more widely distributed. This could be because the skin contains more cold receptors than hot receptors suggesting people are more sensitive to cold stimuli than hot stimuli.

Considering the subjective feedback from the users, all the participants stated that it was a new experience for them to try the thermal feedback on the cane grip. They found cold stimuli were more comfortable, and preferred cold stimuli over the hot ones. This could be due to the hot stimuli being closer to the pain threshold. One participant said that "Cold sensation is better. Hot is too difficult to absorb, especially when the hand sweats." Four participants reported the hot sensation to be very "feeble". Another participants explicitly stated that the two modules at the bottom (#3 and #4) were difficult to distinguish.

The results of the recognition accuracy decreasing along with the increment of the module number is aligned with the existing research showing that the spatial acuity reduces with the reduction on the distance between two thermal stimuli. While the three-modules grip yielded the best performance, the four-module configuration was chosen over the three-modules one for further study. This was primarily because the four-modules configuration could offer higher expressiveness for communication with more Peltier modules. In addition, there was no significant difference between the three-modules and the four-modules configuration, in terms of the accuracy, the response time, and the rated workload.

During the post-experiment interview, the participants were also asked to rank their preference on the configurations for guiding navigation. 11 participants preferred the configuration with four modules. Furthermore, they tended to assign the cold stimuli, instead of the hot ones, for the directional cues due to the ease to perceive, and map the directions of forward, turn left, and turn right, to top, left, and right stimuli respectively. Even though the U-turn cue is not widely used by the BVI users, all the participants agreed to the idea of using the bottom cold stimuli for the U-turn. A multi-factorial repeated measures was performed on the participants' data of the four-modules configuration, taking the temperature-change direction and the positions of the four stimuli as the independent variables. The results revealed that there was no significant effect of the stimuli position on the participants' performance (i.e., the accuracy and the response time). On the other hand, the temperature-change direction placed a significant effect on the accuracy (F(1,11)=5.21, p<0.05, $\eta$=0.321) and the response time p(F(1,11)=18.92, p<0.005, $\eta_p^2$=0.632). The post-hoc Bonferroni test showed that the cold stimuli yielded significantly higher accuracy (p<0.05) and shorter response time (p<0.005) than the hot ones. These results implied that one may want to consider the cold stimuli more than the hot ones for designing reliable thermal icons, which is consistent with the previous studies.

The first study suggested the four-modules configuration yielded significantly higher recognition accuracy than the five-modules configuration, and it can offer more design options than the three-modules configuration. Therefore, this configuration has been chosen as a preferred embodiment of the ThermalCane grip, and is further used in the directional cues accordingly.

As shown in the Figure, the grip has a body arranged to be grip by the user, wherein the plurality of tactile units are provided on different positions at least partially surrounding a peripheral portion of the body. Preferably, the plurality of tactile units cooperate to provide the plurality of haptic signals on different positions surrounding the peripheral portion.

Some common instructions in navigation devices (e.g., GPS) may include "Go forward", "Stop", "Turn left", "Turn right", and "U-turn". These cardinal directions are also important and widely used in the mobility and the orientation training for BVI persons. Noted that the turn instructions here indicate taking the turn without pausing the pace. Existing research on thermal feedback showed that users tended to associate the hot sensation with uncomfortable and dangerous information, and the cold sensation was rated to be more comfortable and safe. In addition, Study 1 shows no significant difference between the response time toward the top-hot (2.63 s) and the top-cold stimuli (2.54 s). There is no significant difference between the top-hot and cold stimuli in terms of accuracy (95% and 95%) Therefore, in one exemplary embodiment, the hot feedback at the top module may be mapped to the instruction of "Stop". On the other hand, users may choose map the four spots of cold feedback with their respective directions. That is, the cold feedback on the top is mapped to "Go forward", the left for "Turn left", the right for "Turn right", and the bottom for "U-turn" or turning backward 180 degree.

Additionally, the first study showed that the perception of the cold stimuli were more significant in comparison to the hot ones. To ensure the accuracy of perceiving navigation instructions and reduce the risks in navigation, the mapping shown in FIG. 9 was further evaluated in a further study.

For example, as shown in the Figure, the haptic signals include a hot-only sensation stimulations or a cold-only sensation stimulation provided at only a single predetermined position (top, bottom, left or right) surrounding the peripheral portion. Alternatively, the activation of the thermal signal may be flexibly defined by a user, e.g. the plurality of haptic signals includes spatially alternating hot and cold sensation stimulations surrounding the peripheral portion.

Study 2: Walking Experiments for ThermalCane Evaluation

Following the evaluation methods adopted by the other related work on haptic feedback for accessibility, the inventors conducted the second user study with BVI users in a semi-realistic walking context, to evaluate the effectiveness of on-grip thermal directional cues for actual walking users without any visual feedback. Existing research on vibrotactile feedback for outdoor navigation showed that users can accurately recognize the single-spot vibration across fingers and palm with the average accuracy above 95%. Therefore, the inventors also performed a comparison between the thermal and vibrotactile feedback which has been widely used as a type of haptic notification for BVI users.

In this study, the inventors first recruited 6 sighted participants (3 female and 3 male, averagely aging 23 years old) for a pilot test, to validate the feasibility and the safety of using ThermalCane while walking. All these 6 sighted participants were blindfolded during the pilot test. Then, the inventors carried on the same protocol with 6 BVI participants (1 female and 5 male, averagely aging 28 years old). Among the BVI participants, four were congenitally blind, and two has 25% vision. All of the BVI participants have previous experience with existing vibrotactile white-cane products for notifying obstacles. All the BVI and sighted participants had experience on vibrotactile feedback of mobile phones. All the participants were right-handed, and they all held the cane grip in their dominant hands.

The average skin temperature of the BVI participants were 32.3° C. (SD=1.8). All the experiments were completed within 7 days in April. The outdoor temperature was between 23° C. and 32° C. (Mean=27.2, SD=2.1).

For the pilot validation of blindfolded sighted participants, the inventors attached the four-Peltier grip to a wooden stick. The length of the wooden stick is 128 cm, and the average height of the BS participants is 166.67 cm (SD=6.23). In addition, the wooden stick weighs 0.258 kg, which is similar to the white canes popular in the market. The inventors didn't receive any report of difficulty from the BS participants while using the wooden stick with thermal/vibrotactile feedback in walking.

On the other hand, as the body of the human-interface device is attachable at an end of a cane, therefore the BVI participants were allowed to use their own white canes, with the haptic grips mounted on the handles of the canes.

Figure 10:
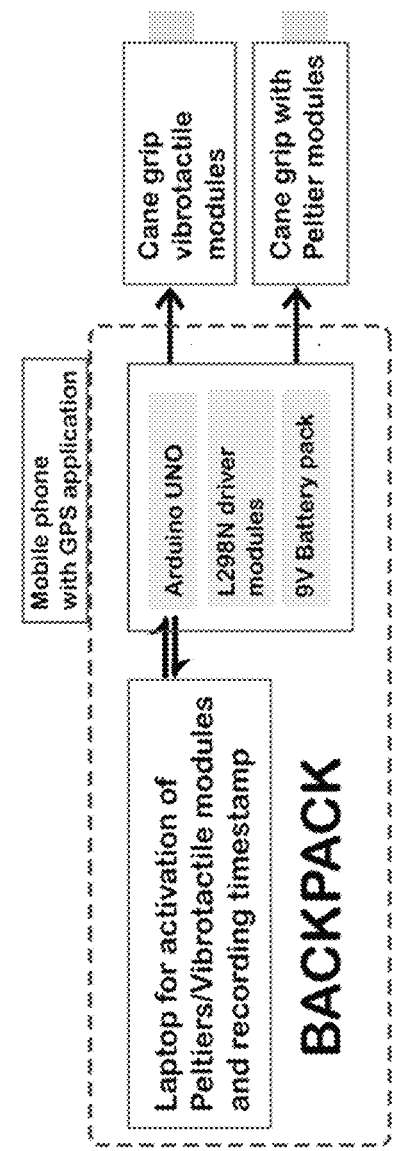
FIG. 10 is a block diagram of the guiding apparatus including the navigation system in accordance with an embodiment of the present invention.

FIG. 10 shows a block diagram of the system including the guiding apparatus used in the study. Besides using the same temperature control mechanism as the one in Study 1, an Android application has been developed to record the participant's real-time GPS data while walking. The application was set up in a Google Nexus 6P mobile phone which was strapped to the shoulder pad of the backpack using a velcro band, as shown in FIG. 11B. The backpack contained the micro-controllers, the motor-driver modules, the battery pack of 9V 2.5 A, and a Microsoft Surface laptop which ran the Processing-based experiment software for stimuli control and data recording.

Optionally, the guiding apparatus may further a navigation module, such as a GPS navigation system, arranged to process position information so as to provide the navigation information to the user, via the set of haptic signals provided by the tactile module. For example, the peltier units may be configured to provide instructions to the user for guiding the user to move forward, stop, left turn, right turn and U-turn, according to a route determined by the navigation module.

For the vibrotactile counterparts, a cane grip embedded with four vibration actuators (3V70 mA and 12000 RPM) with the similar placement as the Peltier modules was used. As shown in FIG. 11A, the vibrotactile grip was designed and fabricated in a modular way, allowing the participant to slide and adjust the position of each actuator to ensure its full contact with the participant's palm. Furthermore, the vibration motor was attached to the grip through a 3 mm layer of foam, to avoid the vibration propagation. Vibrotactile stimuli was controlled by the same system used for the thermal stimuli.

Figure 9:
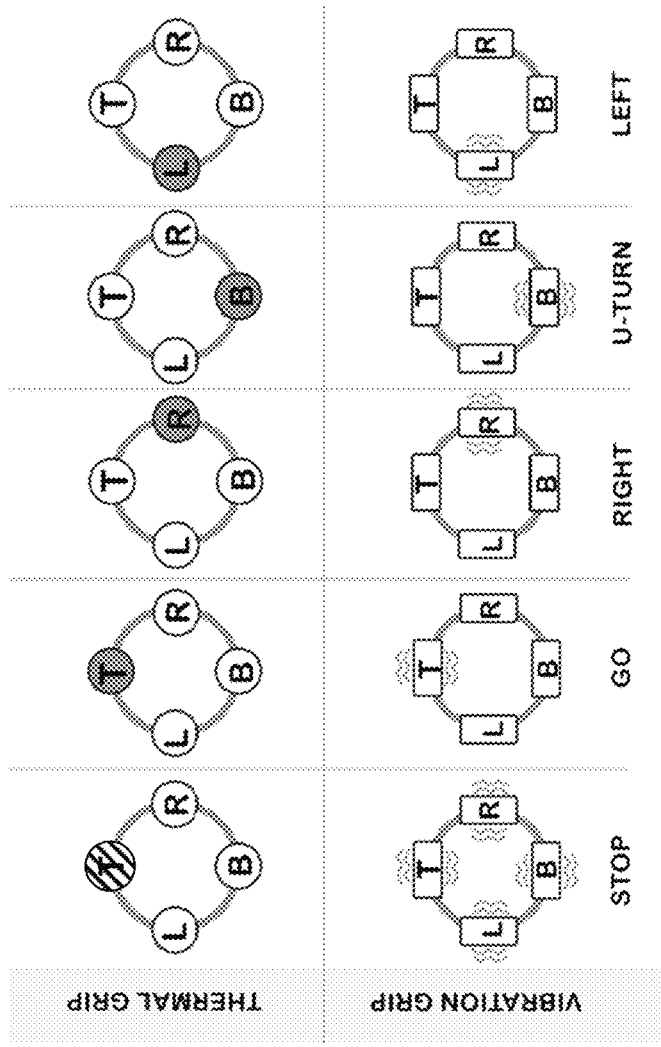
FIG. 9 is an illustration showing thermal and vibrational directional cues (strip: hot, shaded: cold, zig-zag lines: vibration).

Based on previous work on vibrotactile feedback on the wrist, the vibration was at 170 Hz for 1.5 seconds. As shown in FIG. 9, the vibrotactile direction cues of "Go", "Stop", "Turn left", and "Turn right" were directly mapped to the respective positions of the actuators. Similar to the previous research on around-waist vibrotactile directional cues, all the vibration actuators at the same time may be activated to indicate "Stop".

Alternatively or additionally, one or more of the plurality of tactile units are arranged to provide a vibrotactile signal as the first haptic signal or the different haptic signals, instead of the previously mentioned thermal tactile signals. For example, the set of haptic signals includes a combination of a thermal feedback signal and a vibrotactile signal, in which one or more of the direction cues may be mapped to a tactile signal which combines both a thermal feedback and a vibration feedback.

The inventors designed a within-subjects evaluation with the modality and the type of directional cues as the independent variables. The dependent variables were the accuracy and the reaction time of the direction taken with respect to the corresponding stimulus, and the perceived task load of the overall walking task. The thermal and the vibrotactile directional cues were presented to the participant in the Latin-Square counter-balanced order. All the directional cues within the same modality were repeated twice and presented in a randomized order. There was a 15-second gap between two consecutive cues. While perceiving the turning cues during walking, the participant was instructed to perform the turn without pausing his/her movement. While perceiving the turning cues in a stand-still status, the participant was asked to perform the turn and start walking at the same time. In addition, the inventors avoided the situation of two consecutive "Stop" cues in the order randomization, to ensure the fluent walking process.

The study was conducted in an open field with the size of around two football fields. The experiment contained one participant and one experimenter, and was divided into two sessions (one for each modality). Each session consisted of one training block and one testing block. Upon arriving at the field, the participant filled the pre-questionnaire to collect their personal information, and the experimenter introduced the procedure of the experiment. For the vibrotactile cues, the experimenter also helped the participant to adjust the placement of the vibrotactile actuators to achieve the full contact between the actuators and the participant's palm while grasping the grip. For the sighted participants, the experimenter then blindfolded them with a normal sleep eye mask, and conducted a 10-minute training on how to use the white cane for walking. Then they started the training block.

During the training block, the participant received the demonstration of the directional cues with the corresponding modality in the clock-wise order, with "Go" as the start and "Stop" as the end. Meanwhile, the experimenter explained the navigation instructions mapped to the cues. Once the participant reported that he/she was familiar with the cues, the experimenter helped the participant wear the backpack, attached the phone to the shoulder strap, and started the GPS recording mobile app. While receiving the "Go" instruction on the palm, the participant started walking, and was asked to perform the navigation according to his/her perception of the directional cues on the palm. After completing each modality session, the participant was asked to complete the NASA-TLX questionnaire. In the end, the participants were interviewed for his/her subjective comments. The overall experiment lasted about 45 minutes per participant.

In this session, the main focus was on the analysis of the data of the BVI participants. Averagely, the participants finished the walking session within 5 minutes (Thermal: Mean=289.67 s, SD=16.75; Vibrotactile: Mean=291.0 s, SD=18.33). The overall average walking distance was 140.87 meters (Thermal: Mean=141.49 metres, SD=36.33; Vibrotactile: Mean=140.26 metres, SD=36.27). The accuracy, the response time, and the participants' subjective task-load rating were further statistically analyzed. Contrary to Study 1, inventors relied on non-parametric statistical tests due to the different homogeneity of variances between levels of factors in this experiment.

Figure 13:
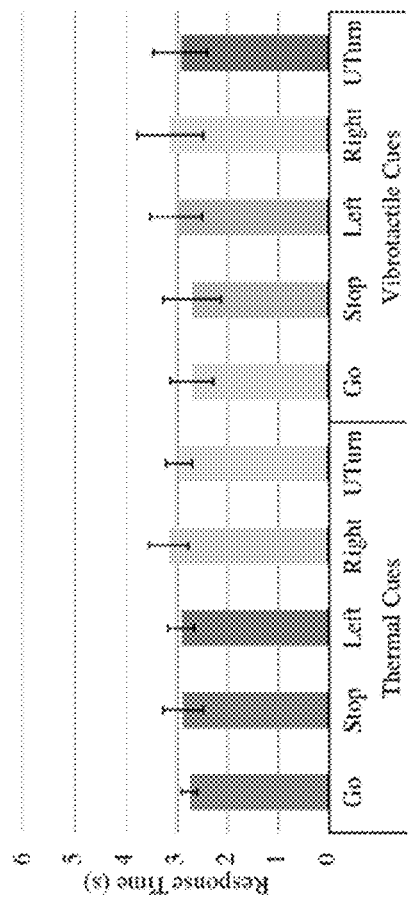

The Wilcoxon Signed Ranks Test showed that there was a significant effect of the feedback modality ($Z=2.21$, $p<0.05$). There was no significant difference on the accuracy cross different navigation instructions. In terms of the response time, the Wilcoxon Signed Ranks Test showed no significant effect of the feedback modality or the type of the navigation instruction, though the thermal cues yielded a slightly but not significantly longer response time (2.96 s) than the vibrotactile cues (2.87 s). FIG. 12 shows the confusion table of the navigation instructions for the BVI participants. FIG. 13 shows the response time of the BVI participants.

Figure 14:
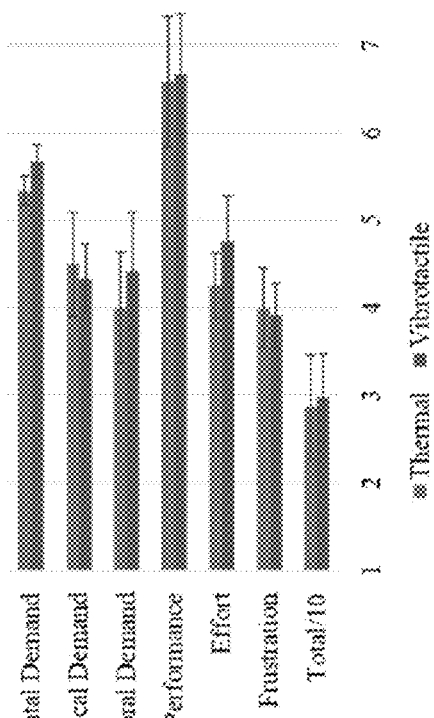
FIGS. 13 to 15 are plots showing, respectively, response time in Study 2 for BVI users, NASA-TLX scores for Study 2, and response time in Study 2 for blindfolded participants.

Friedman tests on the participants' responses to the NASA-TLX questionnaire (FIG. 14) showed no significant difference between the thermal and the vibrational cues, though the thermal cues was rated with slightly lower task load than the vibration cues.

All the BVI participants expressed their preference on the thermal cues over the vibrotactile ones. BVI User #1 said "I need to really focus my attention on the grip to constantly check for the vibration and as a result I am losing the focus on my surroundings and surface that I am walking on." BVI User #2 commented, "I don't have to put much of effort in understanding the (thermal) sensation (cues) as it is very intuitive. I can focus on my surrounding noises and still get to know when to stop with the hot sensation (cue)." About the vibrotactile cues, he commented, "Tapping on the ground creates a sort of vibration, and sometimes we drag the stick on the ground to understand the surface, so I feel that I can easily miss a vibration during that process." BVI User #3 praised the design of hot feedback for stop/emergency. On the other hand, she mentioned that she felt the whole grip vibrating when one single vibration motor was on. BVI User #5 mentioned that he usually loosen the grip while tapping the cane on the ground, but loosening affected his perception of vibration. On the feeling of skin contact, BVI User #5 mentioned that the texture of the peliter modules on the four sides feel nice with a grippy feeling. Both BVI User #4 and BVI User #5 stated that they have been using vibration of indicating obstacles for long, so they prefer keeping this feature for vibrotactile cues, and using the thermal cues for navigation. All the participants suggested the combination of thermal and vibrotactile cues in the cane, "A combination of thermal and vibration would be perfect that it can solve both navigational and obstacle issues with a single device." "Make a combination of thermal and vibration and that would be the best. The cues/feedback of the thermal grip is easy to understand and well thought of. It can pretty much address necessary navigation commands."

One of the participants also reported about the sweating of the palm area due to the prolonged grip holding, and this might affect his performance. The other participant commented, "The temperature stimulation is very soft for me, so it is difficult to detect them". This implies that he may have a different thermal threshold compared to the rest of the participants, further suggesting the support of temperature customization in the future design.

The studies with BVI participants indicated that the thermal feedback in ThermalCane could offer more reliable directional notice than the vibrotactile feedback while a user is walking. Although the global health problem places difficulties in participant recruitment for the inventor's user studies, the current results with six BVI participants show the effectiveness of ThermalCane and encourage more investigations with a larger number of subjects.

The inventors further determined that the overall average response time of the BVI participants in Study 2 was 2.91 s (SD=0.34). With the 1.5 s stimulus in the studies, the overall average response time in Study 2 means the BVI participants responded to a stimulus 1.4 s after it stopped. Considering the general walking speed for BVI persons (0.41 m/s without any assistance), the system with the feature of GPS positioning could activate the thermal directional cue around 0.5 meter ahead.

The inventors devised that the thermal perception and threshold could be affected by body parts or handedness, genders, and ages. In Study 1, the left-handed users achieved 87.2% accuracy and 2.24 s response time, and the right handed with 91.66% and 3.38 s respectively. In Study 2, the females achieved 90.48% accuracy with a response time of 2.32 s, and the males with 92.78% and 2.21 s respectively. Also, it is shown that females may have higher thermal sensitivity than males, and there is no significant difference in terms of thermal sensitivity for left-handed and right-handed persons.

However, study 1 shows the right-handed persons can perceive the thermal feedback more accurately but more slowly than the left-handed; Study 2 shows the males performed slightly better than the females.

While navigation was the most popular application proposed by the BVI participants during the Study 1, they also suggested potential add-on features and other possible applications of ThermalCane. For instance, one male participants with retinal pigmentosa stated, "it would be better if there could be a replay feature with double-tapping a button." One participant who lost 90% of his sight mentioned that it is better to put the thermotactile directional cues on the cane than on the wrist since the wrist could be in various orientation depending on the body posture. One participant who is currently using a vibrotactile smartcane product commented, "it could be really helpful for the navigation using SmartCane [with thermal feedback] if I can make my custom directional cues." Two participants mentioned the similar thermal stimuli could also integrated in the bicycle handles or the steering wheel, to benefit the sighted people, and this comment echoed with a study on haptic steering wheel for driving. It also points to a potential future direction on supporting BVI users' driving with multimodal haptic feedback. Another two participants suggested that this type of around-grip thermal feedback could also be used for phone-call notification. One future direction could be investigating BVI users' perception on the animated spatial thermal patterns around the grip and exploring their potential applications.

Though comparing the performance of the sighted and the BVI participants was not a focus of the study, there exists a difference between the performance of the blindfolded sighted (BS) participants in the pilot validation and the BVI participants in the actual study. The recorded data showed that there was no significant statistical difference between the BVI participants' and the blindfolded-sighted users' perception accuracy towards the thermal directional cues, though the BVI participants performed more accurately than the BS users (94.77% vs 86.67%). It was also found that the BS users perceived the vibrotactile cues slightly more accurately than the BVIs did (71.11% vs 65.33%). This could be explained by, during the pilot test that although being instructed and trained to use the cane as the BVIs do, that some sighted participants could not follow the way how BVIs use the cane in the actual testing process. For instance, it was observed that three BS participants who didn't tap the cane on the ground while they were walking. This reduced the in-cane turbulence which may weaken the vibrotactile cues as reported by the BVI participants.

Figure 15:
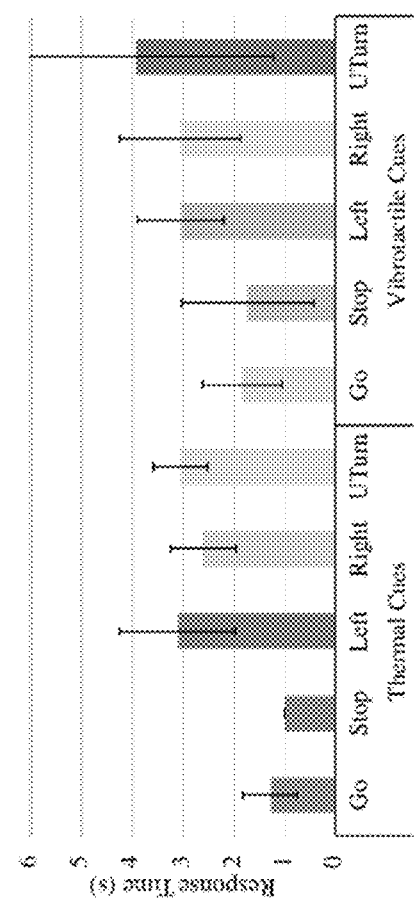

In terms of response time, the BS participants reacted faster than the BVI participants towards the thermal cues (2.21 s vs 2.96 s). Furthermore, it was observed that a larger within-group variation in terms of the response time for the BS participants than the BVI participants. FIG. 15 depicts the response time of the BS participants in the pilot test.

These observation echoed with existing comparison research where the BVI orients/navigates more accurately (but slowly) than the BS, and shows more consistency in the haptic rotation task. In addition, the difference of response time between the two users group could be due to the different environmental temperature during the pilot test and the actual study.

As the environmental temperature may affect one's thermal perception, the average outdoor temperature for the BVI participants was 25.5° C., and 29.7° C. for the sighted participants. Therefore, this may be a confounding factor that caused the different response time between these two groups. This deduction could be partially backed up with the results in Study 1 where the BVI participants could react to the cold stimuli in the 4-module configuration within 2 s averagely, which is close to the sighted participants' response time in Study 2, in an average room temperature of 30.3° C. The different performance across different users further places the needs for the feature allowing users customizing the thermal level by themselves.

Furthermore, two BVI participants in Study 1 commented that the use of ThermalCane may be affected in the situation of the user wearing gloves. Secondly, one participant commented that users may perceive the thermotactile cues differently while walking in different weather. For example, the hot stimuli may be perceived more clearly in a cold day. In addition, previous research showed that thermal perception could vary among different ethnic groups. To solve these issues due to the thermal sensation of the user, the device may be alternatively provided with a wearable body arranged to be worn by the user, wherein the plurality of tactile units are provided on different positions of the wearable body, such as a piece of glove or a pair of gloves.

Moreover, it is possible that BVI users adopt other postures of gripping their canes, and different gripping postures will lead to different hand-contact areas which could affect users' perception on haptic feedback. Therefore, the haptic-module layouts may be optimized for different hand-gripping postures as appreciated by a person skilled in the art.

These embodiments may be advantageous that a novel human-interface device, namely the ThermalCane, may be used as a white-cane grip instrumented with multiple flexible thermal modules, to offer thermotactile directional cues for BVI users' spatial navigation.

Advantageously, the ThermalCane grip can be used as an attachment on top of any ordinary white cane which is used by the visually impaired people. The cane grip surface can exhibit various thermal patterns on the surface depending on the input or pre-set parameters. The user holding the cane can feel various thermal patterns on the palm. Different levels of notifications with distinct intensities and patterns (predetermined by the users) corresponds to the signals received from the connected external devices. These patterns can be helpful to guide the users with their navigation directions, alarms and other smartphone notifications.

The inventors devised an optimal layout for thermal feedback on the white-cane grip based on a detailed evaluation involving BVI users on different configurations of thermal modules and thermal signals. Based on the selected four-module configuration, the inventors designed a set of directional cues provided by the flexible Peltier modules around the ThermalCane grip, and the effectiveness of ThermalCane directional cues with BVI users in the walking context in comparison with the vibrotactile cues as been evaluated.

In the first user study, involving 12 BVI participants, suggested that the participant can reliably identify the spatial thermal stimuli with four flexible Peltier modules around the grip. A set of directional cues with the configuration of four Peltier modules in ThermalCane has been developed.

In the second user study with 6 BVI users showed that the thermotactile directional cues offered by ThermalCane significantly outperformed the vibrotactile cues in the walking situation. Taking ThermalCane as an important step, a multimodal assistive devices for the BVIs may be further developed.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive. For example, other types of force-based haptic feedback, such as poking, pushing, and stretching may be included as different forms of haptic feedback/signal.

Any reference to prior art contained herein is not to be taken as an admission that the information is common general knowledge, unless otherwise indicated.

The invention claimed is:

1. A human-interface device, comprising:
 a body including a peripheral portion and arranged to be gripped by a user; and
 a tactile module arranged to provide a set plurality of haptic signals to a user,
 wherein the tactile module has a plurality of tactile units provided on different positions at least partially surrounding the peripheral portion of the body, each of the plurality of tactile units being arranged to provide at least a first haptic signal and operable to cooperate with one or more of other tactile units to provide different haptic signals;

wherein the plurality of tactile units are operable to cooperate and provide the plurality of haptic signals on different positions surrounding the peripheral portion, and the plurality of haptic signals include, at least, a hot-only sensation stimulation or a cold-only sensation stimulation provided at only a single predetermined position surrounding the peripheral portion.

2. The human-interface device in accordance with claim 1, wherein the first haptic signal includes a thermal feedback signal.

3. The human-interface device in accordance with claim 2, wherein the plurality of tactile units each comprises a thermal pad arranged to provide the thermal feedback signal to the user.

4. The human-interface device in accordance with claim 3, wherein the thermal feedback signal includes increasing and/or decreasing a temperature of the thermal pad.

5. The human-interface device in accordance with claim 4, wherein the thermal pad includes a peltier device.

6. The human-interface device in accordance with claim 5, wherein the peltier device comprises a Bismuth Telluride dice array.

7. The human-interface device in accordance with claim 5, wherein the peltier device is flexible.

8. The human-interface device in accordance with claim 1, wherein each of the plurality of tactile units is further arranged to provide a second haptic signal different from the first haptic signal.

9. The human-interface device in accordance with claim 8, wherein the first haptic signal includes one of a hot sensation stimulation and a cold sensation stimulation; and wherein the second haptic signal includes another one of the hot sensation stimulation and the cold sensation stimulation.

10. The human-interface device in accordance with claim 1, wherein one or more of the plurality of tactile units are further arranged to provide a vibrotactile signal as the first haptic signal or the different haptic signals.

11. The human-interface device in accordance with claim 1, wherein the plurality of haptic signals include a combination of a thermal feedback signal and a vibrotactile signal.

12. The human-interface device in accordance with claim 1, wherein the plurality of tactile units include three to five tactile units provided on different positions surrounding the peripheral portion of the body, and the three to five tactile units are evenly separated from each other.

13. A guiding apparatus for a visually impaired user, comprising:

a cane; and the human-interface device in accordance with claim 1, wherein the body of the human-interface device is attachable at an end of the cane.

14. The guiding apparatus in accordance with claim 13, wherein the human-interface device is further arranged to provide navigation information via the plurality of haptic signals provided by the tactile module.

15. The guiding apparatus in accordance with claim 14, wherein the navigation information includes guiding the user to move forward, stop, left turn, right turn and U-turn.

16. The guiding apparatus in accordance with claim 14, further comprising a navigation module arranged to process position information so as to provide the navigation information to the user.

17. The guiding apparatus in accordance with claim 16, wherein the navigation module includes a GPS navigation system.

18. A human-interface device, comprising:

a body including a peripheral portion and arranged to be gripped by a user; and a tactile module arranged to provide a plurality of haptic signals to a user, wherein the tactile module has a plurality of tactile units provided on different positions at least partially surrounding the peripheral portion of the body, each of the plurality of tactile units being arranged to provide at least a first haptic signal and operable to cooperate with one or more of other tactile units to provide different haptic signals;

wherein the plurality of tactile units are operable to cooperate and provide the plurality of haptic signals on different positions surrounding the peripheral portion, and the plurality of haptic signals include, at least, spatially alternating hot and cold sensation stimulations surrounding the peripheral portion.

19. The human-interface device in accordance with claim 18, wherein the first haptic signal includes a thermal feedback signal, and wherein each of the plurality of tactile units comprises a thermal pad arranged to provide the thermal feedback signal to the user.

20. The human-interface device in accordance with claim 19, wherein the thermal pad includes a peltier device.

21. The human-interface device in accordance with claim 20, wherein the peltier device comprises a Bismuth Telluride dice array; and/or wherein the peltier device is flexible.

22. The human-interface device in accordance with claim 18, wherein each of the plurality of tactile units is further arranged to provide a second haptic signal different from the first haptic signal;

wherein the first haptic signal includes one of a hot sensation stimulation and a cold sensation stimulation; and wherein the second haptic signal includes another one of the hot sensation stimulation and the cold sensation stimulation.

23. The human-interface device in accordance with claim 18, wherein the plurality of tactile units include three to five tactile units provided on the different positions surrounding the peripheral portion of the body, and the three to five tactile units are evenly separated from each other.

24. A guiding apparatus for a visually impaired user, comprising:

a cane; and the human-interface device in accordance with claim 18, wherein the body of the human-interface device is attachable at an end of the cane.

* * * * *